(12) United States Patent
Saito et al.

(10) Patent No.: US 6,218,212 B1
(45) Date of Patent: Apr. 17, 2001

(54) APPARATUS FOR GROWING MIXED COMPOUND SEMICONDUCTOR AND GROWTH METHOD USING THE SAME

(75) Inventors: Tetsuo Saito; Hironori Nishino; Satoshi Murakami; Yoichiro Sakachi, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 08/198,641

(22) Filed: Feb. 18, 1994

Related U.S. Application Data

(63) Continuation of application No. 07/849,340, filed on Mar. 11, 1992.

(30) Foreign Application Priority Data

Mar. 18, 1991 (JP) ................................ 3-052339

(51) Int. Cl.⁷ .................................... H01L 21/00
(52) U.S. Cl. ...................... 438/93; 438/502; 118/795; 118/796
(58) Field of Search ................ 437/81; 118/715, 118/719; 117/957; 438/22, 24, 46, 48, 57, 93, 502

(56) References Cited

FOREIGN PATENT DOCUMENTS

| 0322050 | * 6/1989 | (EP) . |
| 2156857 | 10/1985 | (GB) . |
| 63-318733 | 12/1988 | (JP) . |
| 1-201926 | 8/1989 | (JP) . |

* cited by examiner

Primary Examiner—Charles Bowers
Assistant Examiner—Craig Thompson
(74) Attorney, Agent, or Firm—Staas & Halsey LLP

(57) ABSTRACT

An apparatus for growing a mixed compound semiconductor layer utilizing three or more source gases. The apparatus includes a horizontal type reactor chamber. The reactor chamber includes a partition plate separating an upstream region of the reactor chamber into an upper region and a lower region. The upper and lower regions are joined together forming a growth region in a downstream region of the reactor chamber. First and second inlet ports are provided at an upstream end of the lower region for admitting first and second source gases, respectively. A third inlet port is provided at an upstream end of the upper region for admitting a third source gas. An outlet port is provided at a downstream end of the growth region for exhaust. A substrate stage is arranged in the growth region so that the substrate surface is exposed to the growth region and forms a smooth surface for allowing a laminar gas flow.

25 Claims, 6 Drawing Sheets

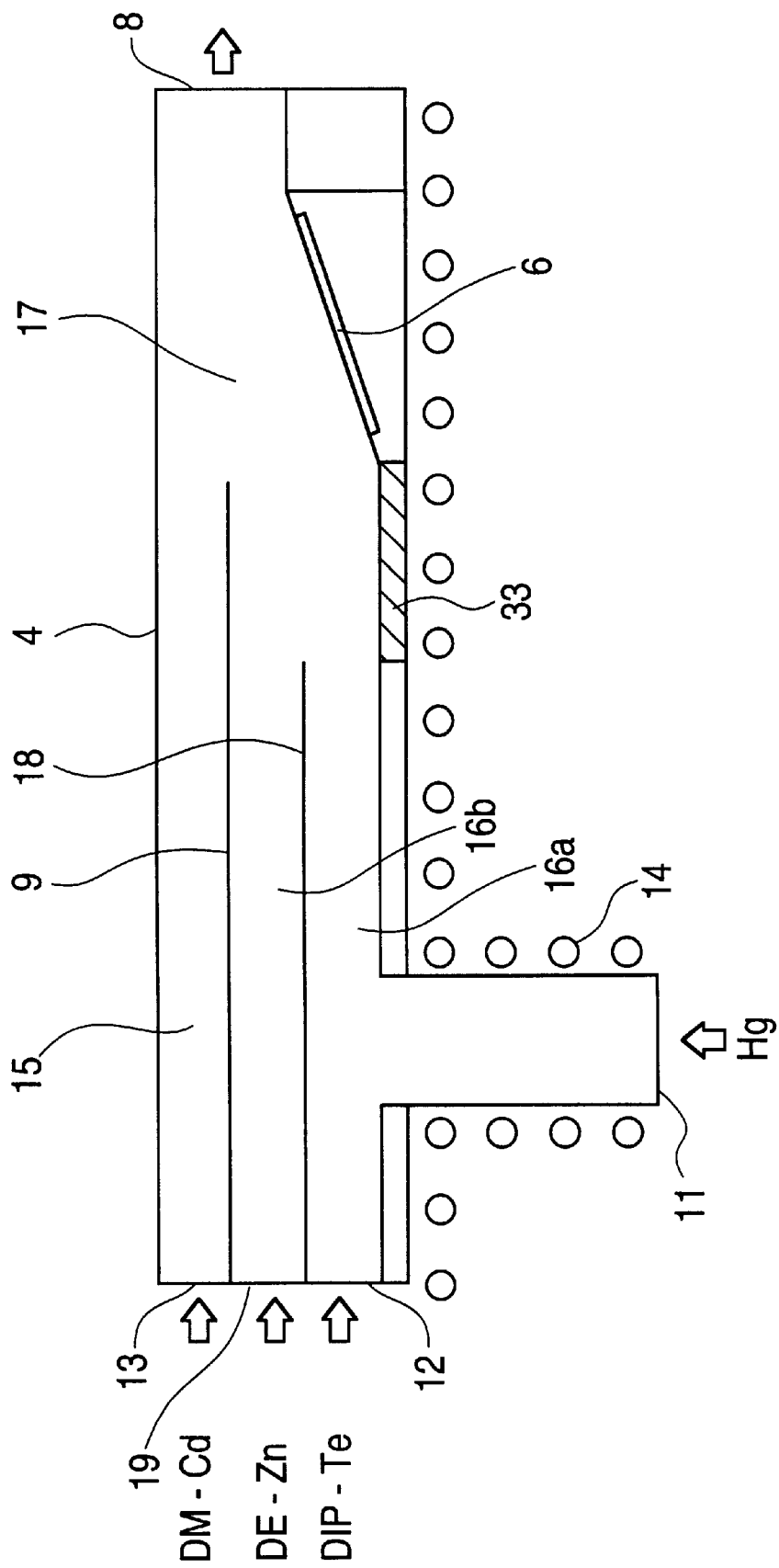

APPARATUS FOR GROWING MIXED COMPOUND SEMICONDUCTOR AND GROWTH METHOD USING THE SAME

This application is a continuation of application Ser. No. 07/849,340, filed Mar. 11, 1992, now abandoned.

BACKGROUND OF THE INVENTION

1. Field of the Invention

The present invention relates to an apparatus for growing a mixed compound semiconductor comprising at least three elements by vapor phase epitaxy. More particularly, the present invention relates to an apparatus for growing a mixed compound semiconductor having a uniform mixing ratio and a growth method using the same.

The mixed compound semiconductor comprises at least two binary compound semiconductors. A different energy is necessary for forming each binary compound semiconductor. When a plurality of source gases, each comprising an element gas are mixed and introduced into a reaction chamber, a grown mixed compound semiconductor layer on a substrate has non-uniform mixing ratios (x-values) depending on a position of the substrate surface. The present invention relates to an apparatus which is used for growing a compound semiconductor layer having uniform x-values throughout the entire semiconductor layer grown on the substrate surface.

2. Description of the Related Art

A prior art method of growing a mixed compound semiconductor utilizes an apparatus schematically shown in FIG. 1. An exemplary ternary semiconductor $Hg_{1-x}Cd_xTe$ of a group II-VI compound semiconductor is used for explaining the prior art method using the apparatus of FIG. 1. The mixed compound semiconductor $Hg_{1-x}Cd_xTe$ has a small energy bandgap characteristic and is known as a detector material for infrared rays. The mixing ratio x included in the above expression $Hg_{1-x}Cd_xTe$ is defined as a ratio of a binary compound semiconductor CdTe to a ternary compound semiconductor HgCdTe and plays an important role in determining the most sensitive wavelength of infrared rays during detection.

A mercury (Hg) bubbler 1 supplies mercury vapor contained in a bubbling hydrogen gas. A diisopropyltelluride (abbreviated hereinafter as DIP-Te) bubbler 2 supplies DIP-Te vapor contained in a bubbling hydrogen gas. A dimethylcadmium (abbreviated hereinafter as DM-Cd) bubbler 3 supplies DM-Cd vapor contained in a bubbling hydrogen gas. The above three source gases are introduced into a reactor chamber 4 in which a substrate stage 5 is arranged. A substrate 6 of, for example, gallium arsenide (GaAs) is disposed on the stage 5 which is heated during growth of the compound semiconductor by an RF coil 7 arranged outside the reactor chamber 4. DIP-Te and DM-Cd source gases are decomposed into element gases, and Te, Cd and Hg molecules react with each other forming a binary semiconductor CdTe and HgTe around the heated substrate and deposit on the substrate 6 forming an epitaxial $Hg_{1-x}Cd_xTe$ layer. The method falls under the category called Metal Organic Chemical Vapor Deposition (MOCVD).

The above method includes a problem that the binary compound semiconductor CdTe is first formed on the upstream side of the mixed source gas flow in the reactor chamber 4 and the binary compound semiconductor HgTe is later formed on the downstream side, since the energy necessary for forming CdTe is smaller than that for forming HgTe. Therefore, the x-value of the grown ternary compound semiconductor $Hg_{1-x}Cd_xTe$ is not uniform on the substrate surface. This is shown in an exaggerated manner by the solid curves 21 and 22 in FIG. 2. The abscissa represents an arbitrary relative distance from an input end of the reactor chamber 4 and the ordinate represents a relative quantity of formed binary semiconductors. Curve 21 denotes that the binary semiconductor CdTe alone is first formed on the upstream side of the reactor chamber and curve 22 denotes that the binary semiconductor HgTe is formed on the downstream side of the reactor chamber. As a result, the grown ternary semiconductor $Hg_{1-x}Cd_xTe$ on the substrate has a composition such that the x-value thereof gradually decreases from 1 (upstream side) to 0 (downstream side) in an extreme case. The larger the distance D between peak positions of the two curves, the more the change in x-value on the surface of the grown ternary compound layer $Hg_{1-x}Cd_xTe$.

As explained above, when at least three source gases are mixed and thereafter introduced into a reaction chamber for growing a mixed compound semiconductor, a binary compound semiconductor having a smaller formation energy is formed on the upstream side of the reaction chamber, and a binary compound semiconductor having a larger formation energy is formed on the downstream side thereof.

In order to improve uniformity of the grown semiconductor, Japanese Unexamined Patent Publication SHO 63-318733 discloses a vertical reactor type MOCVD apparatus in which a preliminary heating plate having a plurality of throughholes which is heated during the growth is disposed on the upstream side of the reactor. Japanese Unexamined Patent Publication HEI 1-201926 discloses a horizontal reactor type MOCVD apparatus, in which heating means is provided in the reactor. However, according to the above two references, since source gases are heated almost uniformly, the difference in formation energies cannot be solved.

SUMMARY OF THE INVENTION

It is a general object of the present invention to provide an apparatus for growing a mixed compound semiconductor layer having a more uniform mixing ratio on a substrate.

It is another object of the present invention to provide a method of growing a mixed compound semiconductor layer having a uniform mixing ratio, which can be precisely controlled.

It is still another object of the present invention to provide an apparatus for growing a group II-VI ternary compound semiconductor $Hg_{1-x}Cd_xTe$ layer having an almost constant x-value over an entire substrate surface.

It is a further object of the present invention to provide an apparatus for growing a mixed compound semiconductor comprising more than three elements such as a quaternary semiconductor and provide a growth method using the apparatus of the present invention.

According to the present invention, these and other objects are achieved by utilizing an apparatus for growing a mixed compound semiconductor layer which comprises a horizontal type reactor chamber. The reactor chamber comprises a partition plate separating an upstream region of the reactor chamber into an upper region and a lower region, the upper and lower regions being joined together and forming a growth region on the downstream side of the reactor chamber. First and second inlet ports are provided at the upstream end of the lower region for admitting first and second source gases respectively, and a third inlet port is provided at the upstream end of the upper region for admitting a third source gas. An outlet port is provided at the downstream end of the growth region for exhaust. A substrate stage is provided for disposing a substrate on which the compound semiconductor layer is being grown, thereby the substrate surface is exposed to the growth region and forms a smooth surface for allowing a laminar gas flow. Heating means is also arranged outside the reactor chamber.

The basic concept of the present invention exists in that the source gas having a smaller formation energy is separated by the partition plate and is later mixed with other sources near the growth region. A preliminary heating unit can enhance reaction of the source gas having a larger formation energy, resulting in forming a mixed compound semiconductor having a uniform mixing ratio. This concept can be applied not only to growing a ternary compound semiconductor but also to growing a quaternary compound semiconductor.

Other aspects, objects, and advantages of the invention will become apparent to one skilled in the art from reading the following disclosure with reference to the drawings.

BRIEF DESCRIPTION OF THE DRAWINGS

FIG. 9 is a schematic cross-sectional view of an apparatus for growing a quaternary compound semiconductor in accordance with the present invention.

Same or like reference numerals designate same or similar parts throughout the drawings.

DESCRIPTION OF THE PREFERRED EMBODIMENTS

Figure 3:
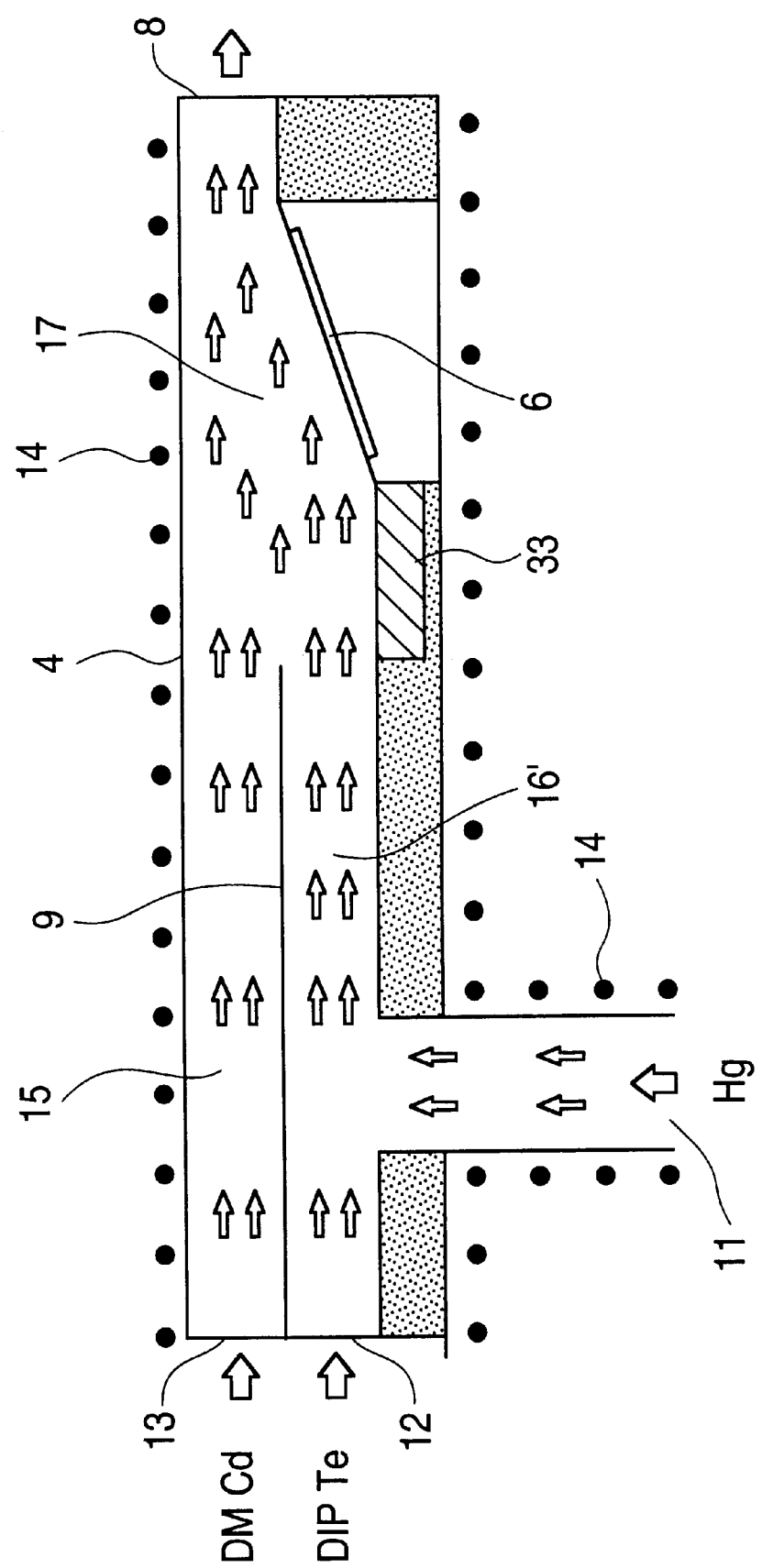
FIG. 3 is a basic cross-sectional view of an apparatus in accordance with the present invention.

The present invention is explained with respect to FIG. 3. FIG. 3 is a schematic cross-sectional view of a basic structure of an embodiment according to the present invention for growing a mixed ternary compound semiconductor $Hg_{1-x}Cd_xTe$. A reactor chamber 4 has three separate inlet ports 11, 12, and 13 for three source gases and one outlet port 8 for exhaust. A carrier gas of hydrogen and mercury vapor are mixed forming a first source gas (Hg) and supplied to the inlet port 11. A hydrogen carrier gas and DIP-Te gas are mixed forming a second source gas (DIP-Te) and supplied to the inlet port 12. A hydrogen carrier gas and DM-Cd gas are mixed forming a third source gas (DM-Cd) and supplied to the inlet port 13. A substrate 6 is disposed on the downstream side of the reactor chamber 4. The surface of the substrate 6 is slightly inclined toward the gas flow.

A specific feature of the apparatus is that a partition plate 9 is provided in the reactor chamber 4. The partition plate 9 extends from the upstream end of the reactor chamber 4 to a middle portion thereof, i.e., a small distance before the substrate position. Therefore, the reactor chamber 4 is divided into an upper region 15 and a lower region 16 on the upstream side and a growth region 17 on the downstream side. The partition plate 9 has a function of separating the third source gas (DM-Cd) from the first and second source gases (Hg and DIP-Te, respectively). A heater 14 encircles the reactor chamber 4, which is heated at a predetermined temperature during the growth to prevent mercury vapor from condensing.

Next, a method of growing an $Hg_{1-x}Cd_xTe$ layer on a gallium arsenide (GaAs) substrate is described. First, hydrogen gas only is introduced into the reactor chamber 4 and the GaAs substrate 6 is heated by an RF coil (not shown) at a temperature of approximately 600° C. for 30 minutes, during which the substrate surface is cleaned removing natural oxides on the substrate surface. Next, the second source gas (DIP-Te) and the third source gas (DM-Cd) are introduced into the reactor chamber 4 with a flow rate of approximately 3 to 6 l/min and a gas pressure of 0.25 atm. The GaAs substrate 6 is heated at approximately 400° C., resulting in forming a CdTe buffer layer on the substrate.

Next, the reactor chamber 4 is heated by the heater 14 at a temperature of approximately 250° C. The first through third source gases are all introduced into the reactor chamber 4, whereby each partial pressure in the source gas is controlled at $1\times10^{-2}$ atm for the Hg gas, $5\times10^{-4}$ atm for the DIP-Te gas, and $5\times10^{-5}$ atm for the DM-Cd gas. The total gas pressure of the mixed source gas is controlled at atmospheric pressure and the total flow rate is controlled at approximately 8 l/min. The substrate 6 is heated by the RF coil to approximately 350° C. to 400° C.

It is easily understood that the formation of CdTe does not occur in the upper region 15 but formation of HgTe does first occur in the lower region 16 before source gases flow into the growth region 17. On the substrate surface 6, decomposed cadmium molecules react with tellurium molecules and deposit on the substrate 6 forming a $Hg_{1-x}Cd_xTe$ layer thereon.

It is further found that a preliminary heating unit 33 which is arranged near the substrate 6 and on the upstream side of the substrate 6 will accelerate the reaction between the first and second gases, i.e., Hg and DIP-Te. The reason therefor is that these two gases have a larger formation energy in forming a binary semiconductor HgTe layer than between DM-Cd and DIP-Te.

Figure 2:
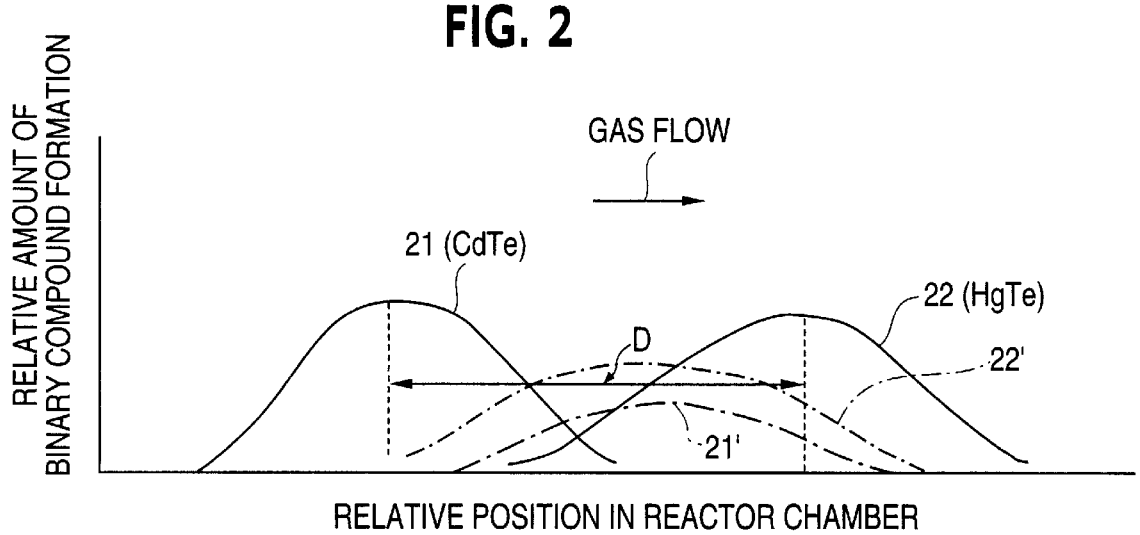
FIG. 2 is a graph showing a relative growth amount versus axial position in a reactor chamber, each curve corresponding to each of two binary compound semiconductors forming a mixed ternary semiconductor, solid curves show data using a prior art apparatus and broken curves show data using an apparatus according to an embodiment of the present invention.

The effect of the above partition plate 9 and the preliminary heating unit 33 is illustrated in FIG. 2. A broken curve 21' shows the formation of CdTe moving toward the right side and a broken curve 22' shows the formation of HgTe moving toward the left side. A distance between peak positions of the two curves becomes very small. When each source gas flow is precisely controlled, flatter curves can be obtained when faster gas flow is used, and a deposition ratio of CdTe to HgTe on the substrate 6 is made substantially constant in the growth region 17, which means the grown $Hg_{1-x}Cd_xTe$ layer has a constant x-value.

The MOCVD apparatus shown in FIG. 3 shows only a basic structure. A detailed structure of the apparatus according to the present invention is shown in FIG. 4. The same reference numerals used therein designate the same or similar parts. A supplementary region 30 which is separated by an auxiliary partition plate 31 is provided in the reactor chamber 4. The supplementary region 30 does not contribute to the flow of source gases, but furnishes space for arranging, for example, a substrate stage 5, a preliminary heating unit 33, and support members 35. The preliminary heating unit 33 has dimensions such as 80 mm×80 mm×5 mm and is made of graphite. The auxiliary partition plate 31 has openings for exposing a substrate 6 on the substrate stage 5 and the preliminary heating unit 33, and has a function of making source gases flow laminar in upper and lower regions 15 and 16 and growth region 17. The support members 35 support the auxiliary partition plate 31 and the preliminary heating unit 33.

Figure 4A:
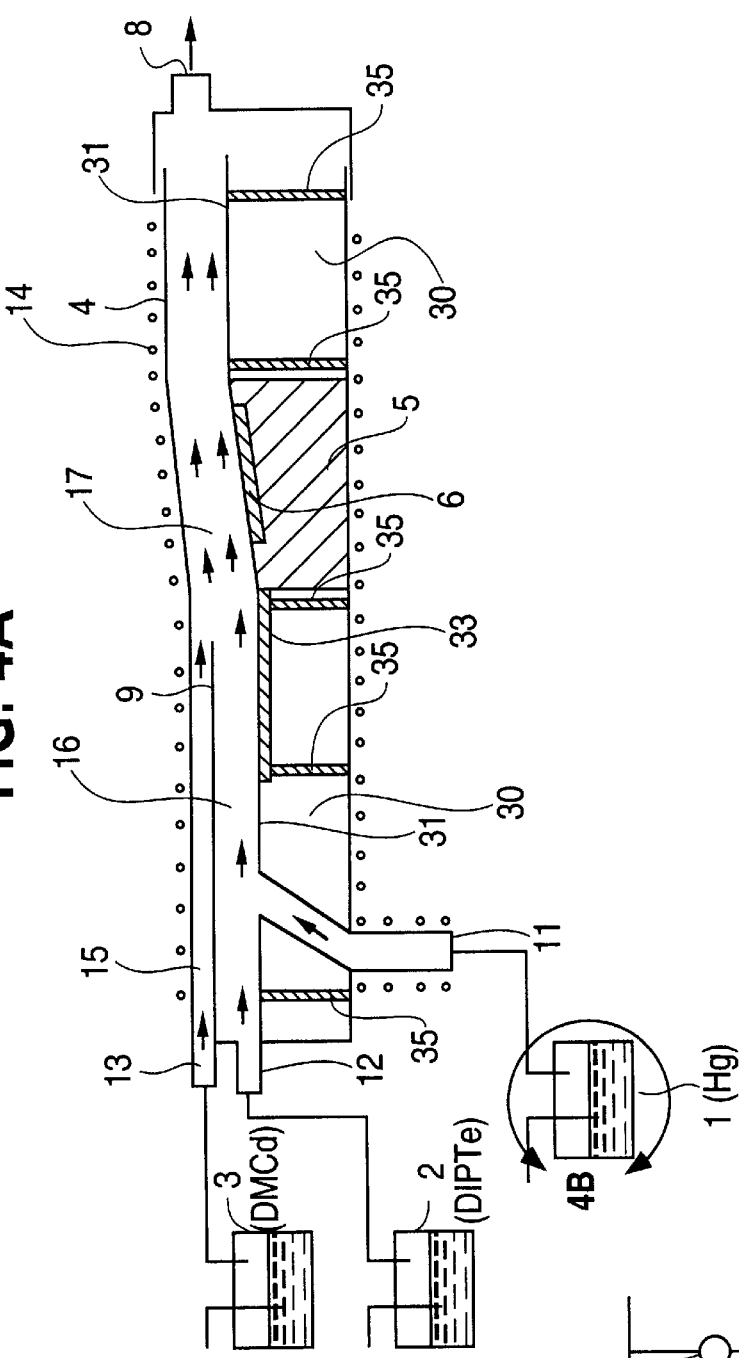
FIGS. 4A and 4B are schematic cross-sectional view of an embodiment of the present invention for growing a ternary compound semiconductor layer.
Figure 4B:
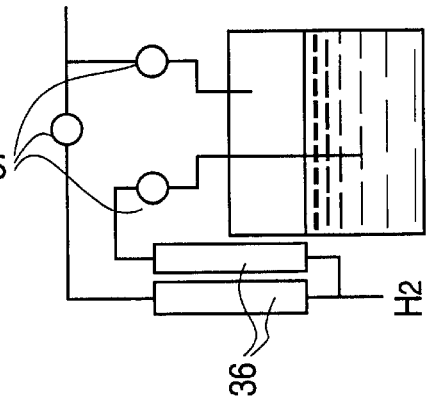

The surface of the preliminary heating unit 33 is exposed to the lower region 16, and is located near the substrate 6 and on the upstream side of the substrate. The preliminary heating unit 33 is heated by means of an RF coil arranged outside the reaction chamber 4, a heater attached to the preliminary heating unit 33, etc., (these are not shown in FIGS. 4A and 4B) to approximately 300° C. during the growth of the $Hg_{1-x}Cd_xTe$ layer. The preliminary heating unit 33 has a function of accelerating the reaction for the formation of HgTe. Each of the bubblers 1, 2 and 3 comprises a mass flow controller 36 and plural valves 37 for controlling a flow rate of source gas. An enlarged view of the bubbler 1 is shown in FIGS. 4A and 4B. The heater 14 encircling the reactor chamber 4 heats the chamber wall to approximately 250° C. to prevent mercury vapor from condensing on the inside wall of the reactor chamber 4.

Figure 5:
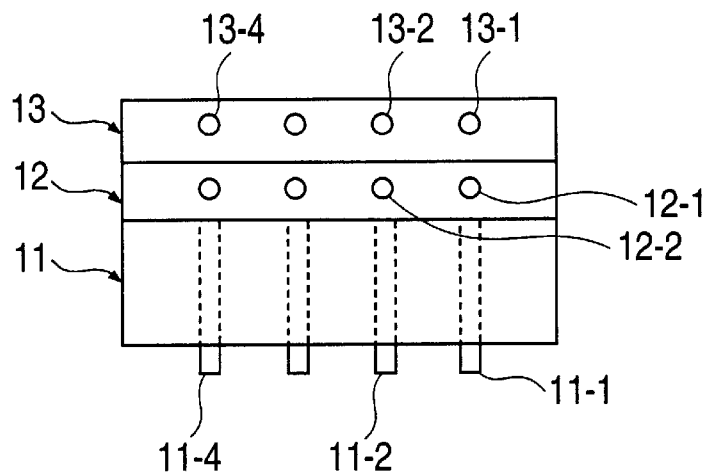
FIG. 5 is a side view of an improved inlet arrangement of source gases into a reaction chamber according to the present invention.
Figure 6:
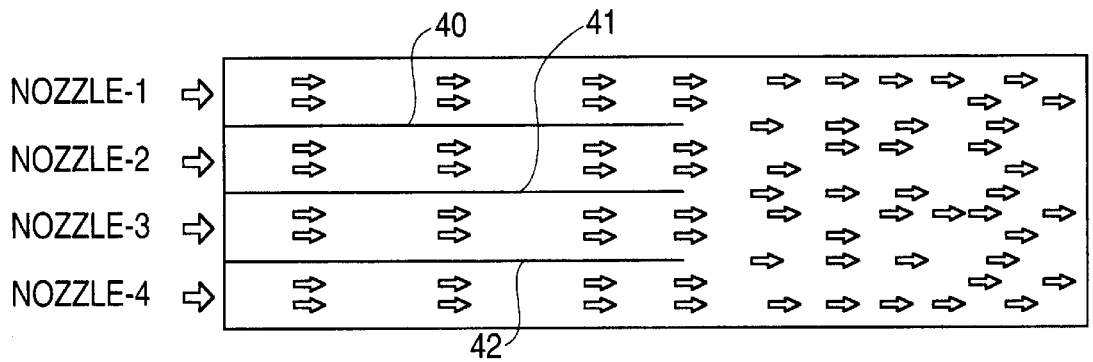
FIG. 6 is a diagram of a top view of a source gas flow when the structure in FIG. 5 is used.

In the embodiment hitherto explained, only a single inlet gas nozzle is illustrated for each of the inlet ports 11, 12 and 13. However, it is preferable to provide a plurality of nozzles for each source gas. FIG. 5 is a side view of the upstream side of the reactor chamber 4, in which each source gas line is branched to four inlet nozzles, 11-1 to 11-4, 12-1 to 12-4, and 13-1 to 13-4. Four inlet nozzles 11-1 to 11-4 are connected to the bubbler 1 of Hg, four inlet nozzles 12-1 to 12-4 are connected to the bubbler 2 of DIP-Te, and four inlet nozzles 13-1 to 13-4 are connected to the bubbler 3 of DM-Cd. By controlling gas flow through each nozzle, uniform laminar gas flows in the upper and lower regions 15 and 16 can be obtained. This is schematically illustrated by a top view of gas flow in FIG. 6, in which reference to nozzle-1 to nozzle 4 corresponds to the respective four nozzles for each source gas. The upper and lower regions are further partitioned by an additional three vertical partitions 40, 41 and 42 which contribute to increase the uniformity of gas flow. By controlling the gas flow of each of the inlet nozzles, an extremely uniform $Hg_{1-x}Cd_xTe$ layer can be obtained.

A method of growing a $Hg_{1-x}Cd_xTe$ layer on a GaAs substrate 6 is substantially similar to the above-mentioned method using the apparatus shown in FIG. 3. At first, the substrate 6 is cleaned by heat treating with hydrogen gas. Secondly, a CdTe buffer layer having a thickness of 4 μm is grown by flowing the second and third source gases thereover. Finally, a $Hg_{1-x}Cd_xTe$ layer having a thickness of 10 μm is grown on the CdTe buffer by flowing all three source gases into the reactor chamber 4.

Figure 1:
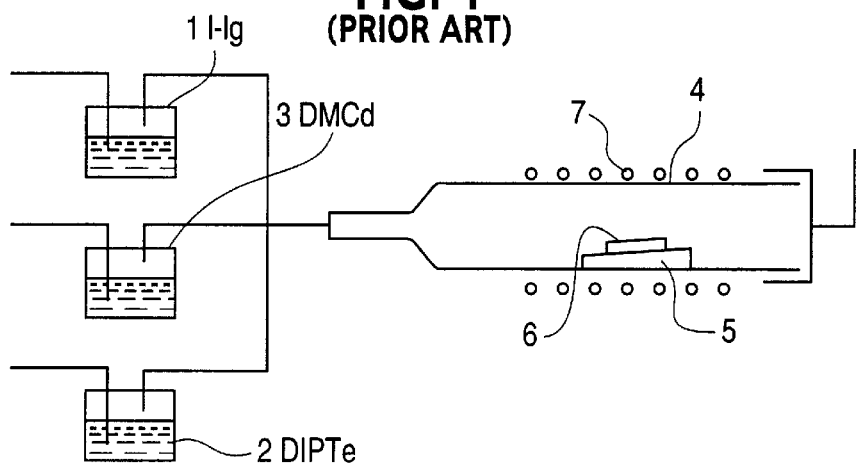
FIG. 1 is a schematic cross-sectional view of a prior art reactor chamber and a source gas system for growing a ternary compound semiconductor.
Figure 8:
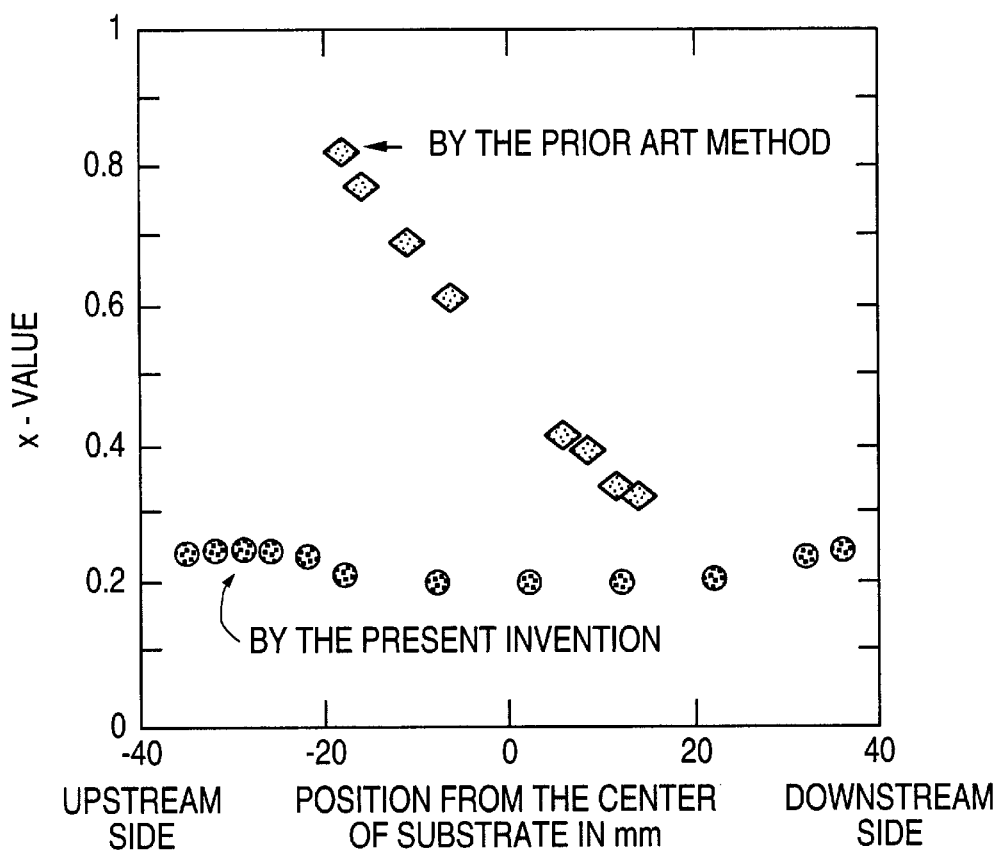
FIG. 8 is a graph of the x-value data obtained according to the present invention, in comparison with the prior art.

After growing the $Hg_{1-x}Cd_xTe$ layer on the substrate 6 having a thickness of 10 μm and a diameter of three inches, x-values are tested changing the position on the substrate surface. The test data are shown in FIG. 8, in which the abscissa represents positions from the center of the substrate 6 and the ordinate represents the x-values. The data shows that a peak-to-peak deviation in x-values is approximately 0.05 for the projected x-value of 0.21. The deviation in x-values is further improved when the substrate 6 is made to rotate during the growth. A rotation mechanism for rotating the substrate stage 5 can be easily incorporated in the apparatus, however, it is omitted for simplicity in FIG. 4. In FIG. 8, prior data utilizing the prior apparatus shown in FIG. 1 is known for comparison purposes. As is shown, there is a tremendous improvement in x-value uniformity in the present invention.

The apparatus thus far described with respect to FIGS. 3 and 4 is used for growing a ternary mixed compound semiconductor, however, the present invention can be applied for growing a mixed compound semiconductor comprising four or more elements.

In growing a quaternary compound semiconductor such as $Hg_{1-x-z}Cd_xZn_zTe$, four sources gases are utilized, namely, Hg, DIP-Te, DM-Cd source gases as previously described and a diethylzinc (DE-Zn) source gas. Formation energies of HgTe, ZnTe and CdTe decrease in this order as shown in the following relation:

HgTe>ZnTe>CdTe.

An apparatus for growing the quaternary compound semiconductor $Hg_{1-x-z}Cd_xZn_zTe$ is shown in FIG. 9, in which a second partition plate 18 and a fourth inlet port 19 are provided. The second partition plate 18 divides a lower region 16 into two regions 16a and 16b. The horizontal length of the second partition plate 18 is shorter than that of a partition plate 9. First and second inlet ports 11 and 12 are used for introducing Hg and DIP-Te source gases, respectively, a third inlet port 13 is used for introducing DM-Cd source gas, and the fourth inlet portion 19 is used for introducing DE-Zn source gas. A partial pressure of DE-Zn gas is approximately $3×10^{-5}$ atm and other conditions for the growth are substantially the same as in the case of growing the ternary compound semiconductor $Hg_{1-x}Cd_xTe$. The apparatus in FIG. 9 shows that the two source gases Hg and DIP-Te which require the largest formation energy when subjected to mutual reaction, are first mixed and heated, and thereafter the source gas having the next largest formation energy is mixed. Finally, the source gas having the smallest formation energy is mixed. A quaternary semiconductor $Hg_{0.7}Cd_{0.2}Zn_{0.1}Te$ having a uniform x-value and a uniform z-value is thus obtained.

In FIG. 9, a heater 14 is provided only for a lower half of the reactor chamber 4. This is because an object of the heater 14 is to prevent mercury from condensing on the inside wall of the reactor chamber 4 and it is preferable not to heat the upper region 15 where the DM-Cd source gas is flowing.

Figure 7:
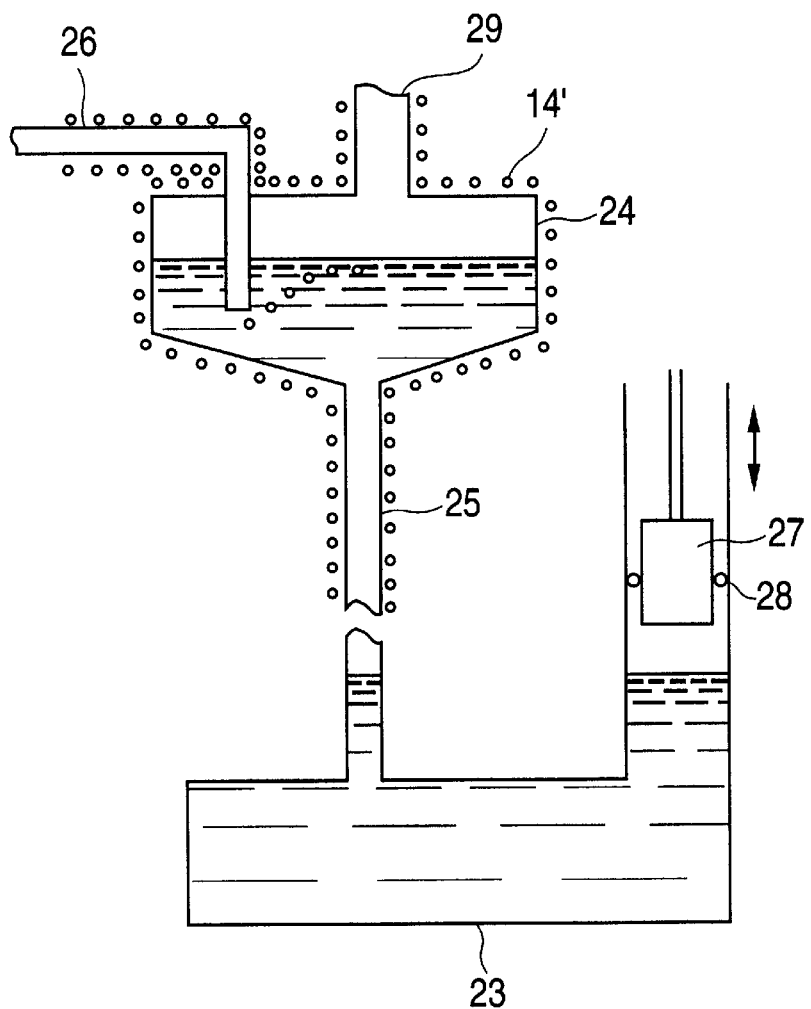
FIG. 7 is a cross-sectional view of a mercury bubbler according to the present invention.

A mercury bubbler 1 which can be used in the present invention is shown in FIG. 7. This type of bubbler 1 easily controls mercury vapor flow and comprises a main bubbler unit 24, a mercury reservoir 23, a connection pipe 25 connecting the main bubbler unit 24 and the mercury reservoir 23, and a piston pump 27 which controls a liquid mercury level in the main bubbler unit 24. A heater 14' is wound around the main bubbler unit 24, a carrier inlet pipe 26 and a connection pipe 29 connected to the inlet port 11. The heater 14' heats walls of these parts except the mercury reservoir 23 at approximately 250° C. while generating the first source gas of Hg. Mercury in the reservoir 23 is cooled and maintained at room temperature. The piston pump 27 is provided with an O-ring 28 to keep the bubbler airtight.

When the piston pump 27 moves in a downward direction, the liquid mercury level in the main bubbler unit 24 rises and the heated bubbled mercury generates the first source gas of Hg. When the piston pump 27 moves in an upward direction, the liquid mercury level in the main bubbler 24 falls, all the liquid mercury is received in the cooled reservoir 23 and the cooled mercury stops generating the first source gas. The Hg bubbler 1 in FIG. 7 has the advantages of eliminating a conventional valve for mercury vapor, which is made of quartz and is fragile.

The bubbler shown in FIG. 7 with the piston pump 7, which is ON-OFF controlled, makes it possible to alternately supply the first source gas Hg. A super-lattice structure of CdTe and HgTe layers can be easily obtained utilizing this type of mercury bubbler.

The above discussion on the application of the growth apparatus of the present invention was with respect to growing group II-VI compound semiconductors such as ternary $Hg_{1-x}Cd_xTe$ and quaternary $Hg_{1-x-z}Cd_xZn_zTe$. It is obvious that the invention may be applied to growing any other compound semiconductor layers such as a group III-V compound semiconductor.

The presently disclosed embodiments are, therefore, to be considered in all respects as illustrative and not restrictive, the scope of the invention being indicated by the appended claims, rather than the foregoing description, and all changes which come within the meaning and range of equivalence of the claims are, therefore, to be embraced therein.

What is claimed is:

1. An apparatus for growing a compound semiconductor layer including at least three elements utilizing a plurality of source gases, said apparatus comprising:
   a horizontal type reactor chamber, said reactor chamber comprising:
   a first partition plate having a flat surface and separating an upstream region of said reactor chamber into an upper region and a lower region, each of said upper and lower regions extending in a gas flow direction;
   a growth region, located downstream of said first partition plate;
   first and second inlet ports at an upstream end of said reactor chamber for admitting first and second source gases into said lower region, respectively;
   a third inlet port at an upstream end of said reactor chamber for admitting a third source gas into said upper region;
   an outlet port provided at a downstream end of said growth region for exhaust; and
   a substrate stage for holding a substrate provided in said growth region.

2. An apparatus for growing a compound semiconductor layer as recited in claim 1, said apparatus further comprising means arranged outside said reactor chamber for heating said reactor chamber.

3. An apparatus for growing a compound semiconductor layer as recited in claim 1, said apparatus further comprising a preliminary heating unit arranged in said reactor chamber, said preliminary heating unit being located near said substrate and on an upstream side of said substrate, a substantial surface portion of said preliminary heating unit being exposed to said lower region forming a smooth surface for admitting laminar gas flow.

4. An apparatus for growing a compound semiconductor layer as recited in claim 3, said reactor chamber further comprising:
   support members;
   an auxiliary partition plate; and
   a supplementary region separated by said auxiliary partition plate from said lower region and said growth region, said supplementary region furnishing a space for arranging said substrate stage, said preliminary heating unit, and said support members, said auxiliary partition plate being provided with openings for exposing said substrate surface and said preliminary heating unit to the laminar gas flow.

5. An apparatus for growing a compound semiconductor layer as recited in claim 1, wherein said reactor chamber further comprises:
   a second partition plate arranged in parallel with a below said first partition plate, said second partition plate having a length shorter than a length of said first partition plate and extending from said upstream region toward said growth region, first and second lower regions being formed in said lower region, said first lower region provided with said first and second inlet ports; and
   a fourth inlet port provided at an upstream end of said reactor chamber for admitting a fourth source gas into said second lower region.

6. An apparatus for growing a compound semiconductor layer as recited in claim 5, wherein said fourth inlet port is provided at a side portion of said reactor chamber corresponding to said second lower region.

7. An apparatus for growing a compound semiconductor layer as recited in claim 5, wherein the compound semiconductor layer is a group II-VI quaternary compound semiconductor, said first, third and fourth source gases, respectively, comprise a different element selected among group II elements, and said second source gas comprises a group VI element.

8. An apparatus for growing a compound semiconductor layer as recited in claim 7, wherein said quaternary compound semiconductor layer is $Hg_{1-x-z}Cd_xZn_zTe$, and said first, second, third and fourth source gases comprise, respectively, mercury, diisopropyltelluride, dimethylcadmium and diethylzinc.

9. An apparatus for growing a compound semiconductor layer as recited in claim 8, wherein said first source gas of mercury is supplied from a mercury bubbler, said mercury bubbler comprising:
   a main bubbler unit;
   a heater for heating said main bubbler unit at a predetermined temperature;
   a mercury reservoir connected to said main bubbler unit by a connection pipe; and
   a piston pump attached to said mercury reservoir, a mercury level in said main bubbler unit being controlled by the movement of said piston pump.

10. An apparatus for growing a compound semiconductor layer as recited in claim 5, wherein a plurality of nozzles are provided with each of said inlet ports, and source gas flow through each nozzle can be controlled individually.

11. An apparatus for growing a compound semiconductor layer as recited in claim 1, wherein said first inlet port is provided at a bottom portion of said lower region and said second and third inlet ports are provided at a side portion of said reactor chamber corresponding to said lower and upper regions, respectively.

12. An apparatus for growing a compound semiconductor layer as recited in claim 1, wherein a plurality of nozzles are provided with each of said inlet ports, and source gas flow through each nozzle can be controlled individually.

13. An apparatus for growing a compound semiconductor layer as recited in claim 1, wherein the compound semiconductor layer is a group II-VI ternary compound semiconductor, said first and third source gases, respectively, each comprise a different element selected from among group II elements, and said second source gas comprises a group VI element.

14. An apparatus for growing a compound semiconductor layer as recited in claim 13, wherein said ternary compound semiconductor layer is $Hg_{1-x}Cd_xTe$, and said first, second and third source gases comprise, respectively, mercury, diisopropyltelluride and dimethylcadmium.

15. An apparatus for growing a compound semiconductor layer as recited in claim 14, wherein said first source gas of mercury is supplied from a mercury bubbler, said mercury bubbler comprising:
  a main bubbler unit;
  a heater for heating said main bubbler unit at a predetermined temperature;
  a mercury reservoir connected to said main bubbler unit by a connection pipe; and
  a piston pump attached to said mercury reservoir, a mercury level in said main bubbler unit being controlled by the movement of said piston pump.

16. A method of growing a ternary compound semiconductor layer utilizing first, second and third source gases, each source gas comprising first to third elements, respectively, forming the ternary compound semiconductor, binary semiconductor formation energy of the third source gas reacting with the second source gas is smaller than that of the first source gas reacting with the second source gas, said method comprising the steps of:
  (a) mixing the first and second source gases and flowing the mixed gas toward a growth region, the mixed gas being heated at a predetermined temperature before reaching the growth region;
  (b) flowing the third source gas and mixing the third source gas with the previously mixed first and second source gases in the growth region where a substrate is disposed; and
  (c) heating the substrate to a predetermined temperature to obtain the ternary compound semiconductor.

17. A method of growing a ternary compound semiconductor layer as recited in claim 16, wherein the grown ternary compound semiconductor layer comprises $Hg_{1-x}Cd_xTe$, and said first, second and third source gases comprise, respectively, mercury, diisopropyltelluride and dimethylcadmium.

18. An apparatus for growing a compound semiconductor layer comprising at least three elements utilizing a plurality of source gases, said apparatus comprising:
  a reactor chamber including:
    an auxiliary partition plate extending in a gas flow direction and separating said reactor chamber into a main reactor region and a supplementary region, said auxiliary partition plate being supported by support members and having openings provided therein;
    a first partition plate having a flat surface and separating an upstream region of said main reactor region into an upper region and a lower region, each of said upper and lower regions extending in the gas flow direction;
    a growth region located downstream of said first partition plate;
    a substrate stage for holding a substrate thereon and a preliminary heating unit arranged in said supplementary region, thereby said openings in said auxiliary partition plate exposing surfaces of said substrate and said preliminary heating unit to laminar gas flow;
    inlet ports corresponding to the number of elements at an upstream end of said upper and lower regions of said main reactor region of said reactor chamber for selectively admitting said source gases into said upper and lower regions; and
    an outlet port provided at a downstream end of said growth region for exhaust.

19. An apparatus for growing a compound semiconductor layer as recited in claim 18, wherein the compound semiconductor layer is a group II-VI ternary compound semiconductor.

20. An apparatus for growing a compound semiconductor layer as recited in claim 18, further comprising a second partition plate arranged in parallel with and below said first partition plate, said second partition plate having a length shorter than the length of said first partition plate and extending from said upstream region toward said growth region.

21. An apparatus for growing a compound semiconductor layer as recited in claim 20, wherein the compound semiconductor layer is a group II-VI quaternary compound semiconductor.

22. An apparatus for growing a compound semiconductor layer as recited in claim 18, wherein a first one of said source gases is mercury and said mercury is supplied from a mercury bubbler, said mercury bubbler comprising:
  a main bubbler unit;
  a heater for heating said main bubbler unit at a predetermined temperature;
  a mercury reservoir connected to said main bubbler unit by a connection pipe; and
  a piston pump attached to said mercury reservoir, a mercury level in said main bubbler unit being controlled by the movement of said piston pump.

23. An apparatus for growing a compound semiconductor layer as recited in claim 1, said apparatus further comprising means for rotating said substrate.

24. A method for manufacturing a group II-VI ternary semiconductor on a substrate, employing an apparatus having three inlet ports and including a growth region, said method comprising the steps of:
  (a) providing first, second and third source gases, each of the source gases comprising a respective element forming the ternary semiconductor;
  (b) supplying the first and second source gases to first and second inlet ports of the apparatus, respectively, the first and second source gases being mixed and heated at a predetermined temperature before reaching a growth region of the apparatus;
  (c) supplying the third source gas to a third inlet port of the apparatus, the third source gas being mixed with the previously mixed first and second source gases; and
  (d) heating a substrate to a predetermined temperature to obtain the ternary semiconductor on the substrate.

25. A method as recited in claim 24, wherein the grown ternary semiconductor comprises $Hg_{1-x}Cd_xTe$, and the first, second and third source gases comprise, respectively, mercury, diisopropyltellurium and dimethylcadmium.

* * * * *